United States Patent [19]

Larkins

[11] Patent Number: 4,935,647
[45] Date of Patent: Jun. 19, 1990

[54] GROUP III - V SEMICONDUCTOR DEVICES WITH IMPROVED SWITCHING SPEEDS

[75] Inventor: William Larkins, Camarillo, Calif.

[73] Assignee: Vitesse Semiconductor Corporation, Camarillo, Calif.

[21] Appl. No.: 259,830

[22] Filed: Oct. 19, 1988

[51] Int. Cl.$^5$ .................. H03K 19/094; H03K 5/12
[52] U.S. Cl. ............................. 307/450; 307/451; 307/263; 307/548
[58] Field of Search ............... 307/443, 448, 450, 451, 307/546–548, 263

[56] References Cited

U.S. PATENT DOCUMENTS 4,810,969  3/1989  Fulkerson ........................ 307/548

FOREIGN PATENT DOCUMENTS 0256918  2/1988  European Pat. Off. ............ 307/448

Primary Examiner—Stanley D. Miller
Assistant Examiner—Margaret R. Wambach
Attorney, Agent, or Firm—Ashen Golant Martin & Seldon

[57] ABSTRACT

To decrease the time required to charge parasitic capacitances, and to thereby increase the maximum permissible switching frequency to which a logic circuit can respond, a GaAs device is disclosed having a current-injecting circuit that generates an initial pulse of capacitor-charging current during a "0"-to-"1" transition in the output state of a GaAs device. The pulse is sufficiently large to quickly charge the parasitic capacitances, and of sufficiently brief duration so that a minimum line width is permissible which is substantially equivalent to that which would be applicable in the absence of the current-injecting circuit.

2 Claims, 3 Drawing Sheets

GROUP III - V SEMICONDUCTOR DEVICES WITH IMPROVED SWITCHING SPEEDS

This invention relates to Group III-V semiconductor devices and, more particularly, to devices of that type which can be fabricated as arrays.

BACKGROUND OF THE INVENTION

Gate arrays are integrated circuits which are composed of numerous uncommitted transistors. While a circuit designer can, theoretically, interconnect the transistors in any way he chooses to provide the desired logic functions, the designer typically designs the circuit utilizing predesigned macros. A macro is a predetermined combination of transistors which form a defined logic function. The designer can simply select the desired macros from the chip manufacturer's "library", and implement his design by interconnecting the macros. By providing a standardized product having numerous applications, and by enabling the circuit designer to ignore transistor-level details when contemplating a circuit, gate arrays reduce prototype and production turn-around time, engineering costs, and the ultimate cost of the circuit to the end user. Metal-gallium arsenide devices (GaAs) have recently been developed as a preferable alternative to silicon based devices in the building of digital logic gates, where faster switching times and lower dc power dissipation are desirable. First generation logic gates built with GaAs FET's, for example, have exhibited switching times as low as 80 psec with 1-2.5 mW power dissipation.

GaAs FET's are generally similar to silicon MOSFET's in structure. However, while the gate of a silicon MOSFET is insulated from the rest of the device by a dielectric layer, a suitable dielectric does not exist for GaAs; accordingly, the gate region of a GaAs FET typically forms a Schottky barrier diode. Consequently, the maximum gate to source voltage $V_{gs}$ of the GaAs FET is approximately 0.8 volts.

As with silicon nMOS and pMOS devices, GaAs logic devices are typically built around an inverter circuit. As illustrated in FIG. 1, a GaAs inverter typically comprises an enhancement mode (E-mode) FET 1 having its source "s" coupled to the bottom rail $V_{SS}$, and its drain "d" coupled to the top rail $V_{DD}$ through a resistive element in the form of a second FET 2. The output of the inverter is the drain "d" of the FET 1, while the input to the inverter is the gate "g" of the FET 1. The resistive element is conveniently a depletion mode (D-mode) FET having its drain "d" tied to the top rail $V_{DD}$, and its source "s" and gate "g" tied together and to the drain "d" of the E-mode FET 1. The D-mode FET 2 is commonly referred to as the "pull-up" device, while the E-mode FET is referred to as the "pull down" device. Those skilled in the art will recognize that the D-mode pull-up FET 2 is always conducting because its gate-to-source voltage $V_{gs}$ is fixed at zero, and that it effectively provides a current-dependent, non-linear resistance when configured in the illustrated manner.

Those skilled in the art recognize that there is a delay between a change of input state at the gate of a GaAS inverter and the consequential change of output state at the drain of FET 1. Further, the delay in a rising output is greater than that for a falling output.

The transition delays described above limit the maximum switching frequency of the inverter. If, for example, the input to the inverter undergoes a first state change from "0" to "1", followed by a second state change from "1" to "0", the output state of the inverter will simply not change if the second state change occurs before the inverter can respond to the first.

The amount of delay experienced by a GaAs inverter is a function of the capacitance of the load coupled to the output of the inverter. Capacitive loads result from parasitic capacitance in the FET structures, in the bus lines on the chip, and so forth, and from the parasitic capacitances associated with devices coupled to the inverter's output. In effect, the delay is the result of the time required to charge and/or discharge the parasitic capacitances.

The delay associated with a rising output is greater than that associated with a falling output because there is less current available for charging the parasitic capacitors when the output changes in that direction; i.e., from a logic '0' to a logic '1'. The difference in available current, in turn, is a consequence of the relative sizing of the pull-down E-mode FET 1 and the pull-up D-mode FET 2. Typically, the channel of the pull-up FET 1 is sized to overpower the pull-down FET 2 to ensure a solid logic '0' when the inverter input is a logic '1'. Thus, the pull-down FET 1, when turned on, supplies much more current during the '1' to '0' output transition than the D-mode FET 2. As a result, the discharge current, when transitioning from a logic '1' to a logic '0', is much greater than the charging current during a '0' to '1' transition.

In summary, then, the gate delay is limited by the D-mode pull-up current. Given a predicted load, such as is possible with custom circuitry, the size of the pull-up FET 2 can simply be chosen to provide sufficient current to satisfy the timing requirement.

As is known in the art, the dimensions of FET 1 and FET 2 are ratioed so that the voltage level of a logic '0' (hereinafter, $V_{lo}$) is sufficiently small to yield a substantial difference between logic levels. However, one consequence of that design necessity is that the pull-up current available to charge the parasitic capacitances is low.

To illustrate the foregoing point, reference is made to FIG. 3, which is a graphic illustration of the inverter's transfer characteristic. To obtain the inverter's transfer characteristic, the pull-up FET's characteristic curve (T2) for $V_{gs}=0$ is superimposed on the pull-down FET's curve (T1). The $V_{gs}=0$ curve is chosen because the gate and source of the D-mode device are tied together. The curve chosen for the E-mode FET is that for a gate-to-source voltage $V_{gs}$ equal to a logic level '1' (hereinafter, $V_{hi}$).

The transfer characteristic of the inverter comprises the intersection point between the D-mode curve T2 and the E-mode curve T1. The voltage at the intersection is accordingly the drain-to-source voltage of the pull-down FET 1 when it is on. This voltage, being logic level '0' is conveniently referred to as $V_{lo}$. The drain-to source current through FET 1 and FET 2 is represented on the graph as $I_1$.

In terms of the graph T2 (FIG. 3), an increase in channel width or decrease in channel length of the pull-up FET 2 effectively raises the graph T2 vertically, thereby yielding an operating point with a larger $I_1$, but also a larger $V_{lo}$. Thus, a larger charging current is obtained at the expense of an undesirably higher level for logic '0'.

In addition, although a small D-mode pull-up current is responsible for a relatively slower output transition, it is also necessary to maintain the current at a sufficiently low value so as to avoid exceeding the electromigration current limitation imposed by the line width on the chip. Naturally, minimal line widths are desirable to maximize the space on the chip available for active components. A larger pull-up current translates into higher power dissipation, and requires larger line widths to avoid electromigration of the metal in the line. Unlike nMOS and pMOS devices, whose gates are insulated from their sources by a dielectric insulator, GaAs devices exhibit a D.C. current flow from their gates to their sources. When driving an output '1', the gate-to-source current of FET 1 is the D-mode pull-up current of FET 2, and sets the minimum linewidth as dictated by the metal migration rules for the interconnect level used.

For custom integrated circuits, the desired rise time may be obtained by simply sizing the pull-up FET appropriately large, and then scaling the interconnect bus to accommodate the D.C. current. In gate arrays and standard cell designs, however, the interconnect bus' width is fixed, placing an upper bound on the pull-up size (and therefore the current), and a corresponding lower bound on the delay imposed by each millimeter of interconnect bus.

In nMOS, the conventional approach for minimizing delay under these circumstances is to couple the inverter to a so-called "push-pull buffer" as illustrated in FIG. 2. The push-pull buffer comprises a pull-up FET 3 whose drain is coupled to the top rail $V_{DD}$ and whose source is coupled to the drain of a pull-up FET 4. Its gate is coupled to the drain of the inverter's pull-down FET 1 at an internal node 6.

The source of the buffer's pull-down FET 4 is coupled to the bottom rail $V_{SS}$, and its gate is coupled to the buffer inverter input; namely, the gate of inverter pull-down FET 1. As with the inverter, the buffer's pull-up FET 3 is a D-mode device which acts as a resister.

The push-pull buffer improves the rise time of the logic device without effecting the ratio needed for the pull-down FET 2. As the input to the inverter, $V_{in}$, changes in a positive direction from logic '0' to logic '1', the inverter comprising FET 1 and FET 2 turns on. The gate of FET 3 is pulled down to the bottom rail. Thus, FET 4 is turned on, thereby pulling the output of the logic device $V_o$ downward very quickly.

When $V_{in}$ changes in the opposite direction (i.e., from a '1' to a '0'), the gate of FET 3 rises very quickly to the top rail $V_{DD}$. As FET 4 is turned off by $V_{in}$, FET 3 is conducting with a voltage approximately equal to $V_{DD}$ at its gate. Since the drain-to-source current of FET 3 is proportional to its gate voltage, and since the gate-to-source voltage of FET 3 is all the way up to $V_{DD}$, the increase in current through FET 3 quickly charges the load capacitances at the buffer output when FET 4 shuts off.

While adequate for use with nMOS devices, however, the use of a push-pull buffer with GaAs devices exacerbates the electromigration problem. Whereas an nMOS device has an insulated gate and therefore no D.C. current flowing down the line, GaAs devices effectively have a forward biased Schottky diode coupling the gate terminal to the source. Accordingly, a push-pull buffer sized to quickly charge the parasitic capacitance, provides a large D.C. current, even after the capacitance has been charged and the current is no longer needed. Thus, by increasing the amount of D.C. current flowing in the device during a logic '1' output, the buffer increases the amount of power which must be dissipated, adversely affecting the goal of minimizing line width. The greater width of the lines, in turn, is detrimental to the maximization of chip density because the wider lines reduce the chip area available for active components.

The design of practical GaAs gate arrays has been severely impeded by the conflicting requirements imposed by the desire to maximize chip density, while minimizing delays arising from the charging of parasitic capacitances. In order to minimize delays, a current must be provided at the buffer output which is sufficiently large to quickly charge the parasitic capacitors. On the other hand, large output currents require wide current-carrying buses to avoid electromigration of the bus material from excessive current densities. Wider buses, however, not only increase the amount of parasitic capacitance, but also occupy room on the chip which can be better used for placing active components.

In addition, the provision of wider buses is unsatisfactory if GaAs arrays are to be manufactured and sold as off-the-shelf items rather than as custom made devices. The designer of the gate array is, in reality, merely providing an array of fundamental solid state devices which will be interconnected in various ways by the user of the chip to form any of a variety of logic devices. In designing an off-the-shelf product, the array designer has no advance knowledge of the configuration of a given net in the array; i.e., the designer does not know how much fan-out capacitance or how much capacitance due to interconnect metalization will exist on a net. Accordingly, the bus width must accommodate the worst case scenario, which is typically much worse than the actual load, needlessly wasting even more of the chip's topography than is necessary.

SUMMARY OF THE INVENTION

The invention herein is a GaAs device suitable for use as a macro within a gate array. As an inverter, the device achieves the improved A.C. performance of a push-pull buffered inverter without suffering the penalty imposed by the heretofore consequential increase in line width. Briefly, a switched clamp shunts the device pull-up current to the bottom rail, except during at least a substantial portion of a '0' to '1' transition at the buffer output. Accordingly, a brief surge of current is available from the buffer to quickly charge the parasitic capacitors, yielding an improved rise time. However, the duration in the surge of current is so brief, a minimal line width substantially equivalent to that which would be applicable in the absence of the push-pull buffer can be utilized without exceeding electromigration limits.

Additional details concerning the invention will be apparent from the following description of the preferred embodiment, of which the following drawing is a part.

DESCRIPTION OF THE PREFERRED EMBODIMENT

Figure 1:
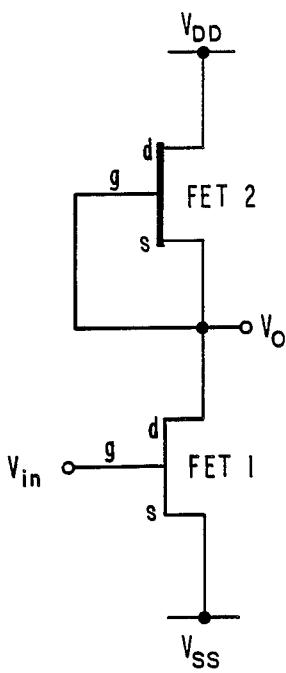
FIG. 1 is a schematic illustration of a basic inverter circuit known in the art.
Figure 2:
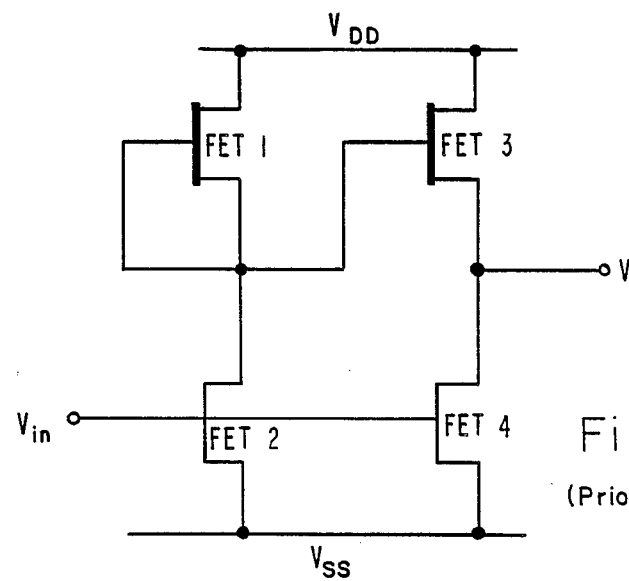
FIG. 2 is a schematic illustration of a basic gate circuit including an inverter and push-pull buffer known in the art.
Figure 3:
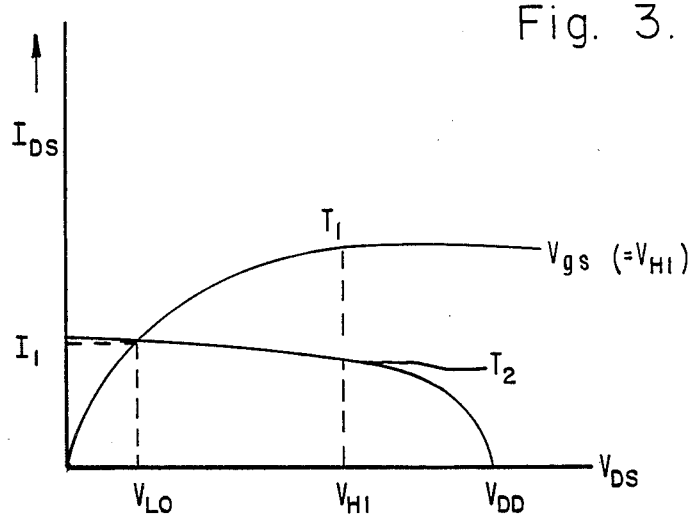
FIG. 3 a graphic illustration of the voltage and current relationships in the inverter circuit.
Figure 4:
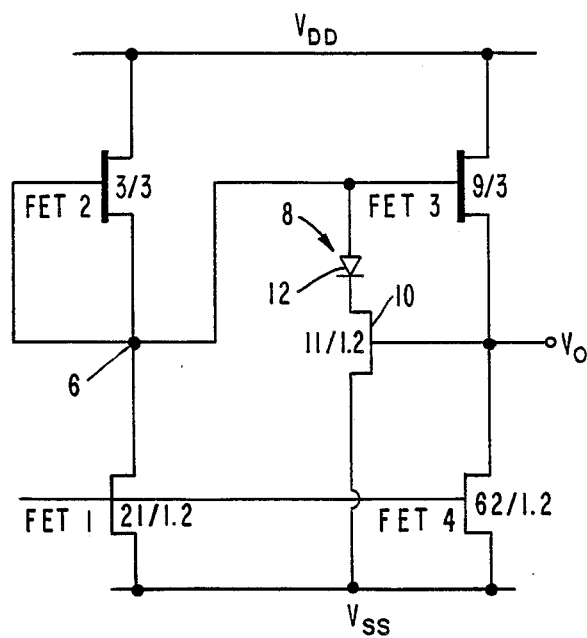
FIG. 4 is a schematic illustration of a buffered GaAs inverter constructed in accordance with the invention.

FIG. 4 is a schematic illustration of a GaAs inverter constructed in accordance with the invention. The inverter comprises an enhancement mode (E-mode) pull-down FET 1 having its source "s" coupled to the bottom rail $V_{SS}$, and its drain "d" coupled to the top rail $V_{DD}$ through a pull-up resistive element in the form of a second FET 2. The output of the inverter is the drain "d" of the FET 1, while the input to the inverter is applied to the gate "g" of the FET 1. The resistive element is conveniently a depletion mode (D-mode) FET having its drain "d" tied to the top rail $V_{DD}$, and its source "s" and gate "g" tied to the drain "d" of the E-mode FET 1. The respective width-to-length ratio of the channel of each FET is indicated in FIG. 4 by the nomenclature "W/L", where W and L are the numerical values of the ratio.

The output of the inverter is coupled to a push-pull buffer comprising comprising a pull-down E-mode FET 4 in series with a resistive device in the form of a D-mode FET 3. As is common with such buffers, the gate of the pull-up D-mode FET 3 is coupled to the drain of the inverter's pull-down F-T 1 at an internal node 6. The output of the buffered inverter $V_o$ is the drain of the buffer's pull-down FET 4.

A clamp 8 responsive to the output $V_o$ of the buffered inverter selectively couples the internal node to the bottom rail $V_{SS}$ to shunt pull-up drain-to-source current from the inverter's pull-up FET 2 to the bottom rail $V_{SS}$. As will be explained below, the clamp shunts the current in this manner except for substantially all of the transition period when the output $V_o$ is changing from logic '0' to logic '1'.

The clamp 8 comprises an E-mode FET 10 whose drain-to-source path is series-coupled with a diode 12 between the internal node 6 and the bottom rail $V_{SS}$. The gate of FET 10 is coupled to the buffer output $V_o$. The diode may conveniently be the Schottky diode of an FET on the chip.

Figure 5:
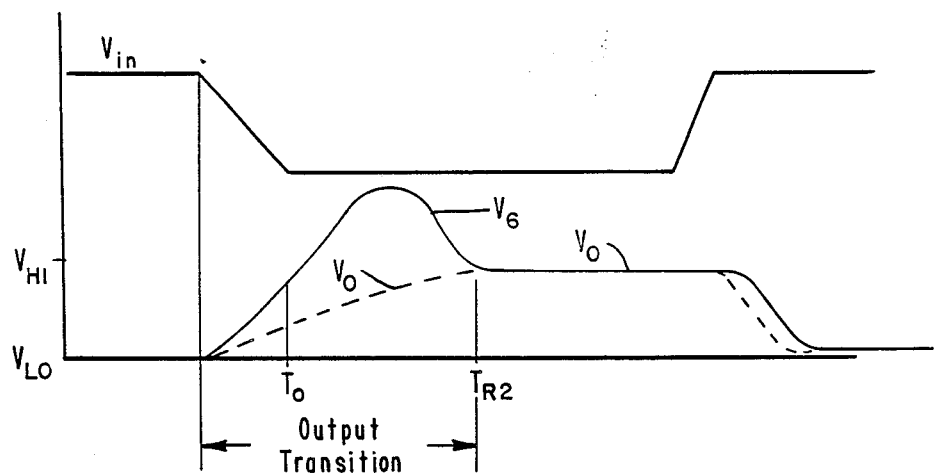
FIG. 5 is a graphic illustration of the voltage relationships in the circuit of FIG. 4.

When, as illustrated by the graph of $V_{in}$ in FIG. 5, a change from '1' to '0' occurs at the input gate of the pull down FET 1 (causing a '0' to '1' transition at the inverter output and buffer output), the voltage of the internal node $V_6$ rises faster than the voltage of the buffer's output $V_o$, heavily biasing the buffer's D-mode FET, and reducing the rise time of the buffer's output $V_o$. As the buffer's output $V_o$ approaches a logic level '1', the FET of the clamp 6 begins to conduct returning the internal node to a voltage level approximately equal to a diode drop (0.7 volts) above the bottom rail $V_{SS}$. In practice, the clamp is designed to switch on just as the buffer output reaches logic level '1'.

When turned on, the clamp maintains the gate-to-source voltage $V_{gs}$ of the inverter's pull-up FET 2 very close to zero, thereby establishing a D.C. output current very close to the current which the pull-down FET 1 is ratioed against.

Utilizing the foregoing technique, the D-mode FET 3 of the buffer can be sized to the same $V_{gs}=0$ worst case current limitation imposed by the minimum metal routing channel, while the rise time of the buffer output is improved without any substantial increase in static power.

Figure 6:
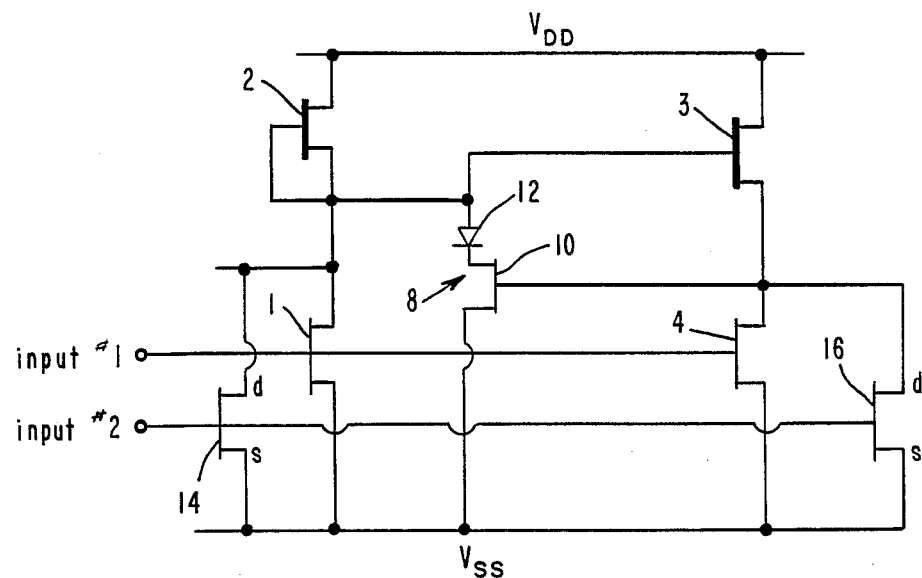
FIG. 6 is a schematic illustration of an NOR circuit constructed in accordance with the invention.

FIG. 6 is a schematic illustration of an NOR gate constructed in accordance with the invention. The structure of the NOR gate is similar to that of the inverter illustrated in FIG. 4, with the addition of two pull-down FETs 14,16. Accordingly, the identifying indicia of the components shown in FIG. 4 have been retained to identify similar components in FIG. 6, for the sake of clarity.

The drain "d" and source "s" of FET 14 are respectively coupled to the drain and source of the FET 2. The gate of FET 2, as in the inverter of FIG. 4, receives a first input logic-level signal. The gate of FET 14 is also adapted to receive a second logic-level signal. Accordingly, the two pull-down FETs 2,14 share a common pull-up FET 1.

The second additional FET 16 has its drain "d" and source "s" respectively coupled to the drain and source of FET 4, and has its gate coupled to the gate of the first additional FET 14 to receive the second input signal. Thus, both FET 4 and FET 16 share the same pull-up device FET 3, and are similarly acted upon by the current-injecting clamp 8.

While the foregoing description includes detail which will enable those skilled in the art to practice the invention, it should be recognized that the description is illustrative in nature and that many modifications and variations will be apparent to those skilled in the art having the benefit of these teachings. It is accordingly intended that the invention herein be defined solely by the claims appended hereto and that the claims be interpreted as broadly as permitted in light of the prior art.

I claim:

1. A solid state inverter comprising:
   first and second power bus means;
   a first depletion mode GaAs transistor having a pair of main terminal means and a gate terminal means electrically coupled to one of its main terminal means at a first node to form an first active impedance element; the other of the main terminal means being coupled to the first power bus means;
   a first enhancement mode GaAs transistor having one of a pair of main terminal means respectively electrically coupled to the first node and the other of the pair of main terminal means electrically coupled to the second power bus means, the first enhancement mode GaAs transistor further having gate terminal means available to receive an input logic level signal to the inverter;
   a second depletion mode GaAs transistor having one of a pair of main terminal means electrically coupled to the first bus means,
   a second enhancement-mode GaAs transistor having one of a pair of main terminal means electrically coupled to the second bus means and the other of the pair of main terminal means electrically coupled to the other main terminal of the second depletion mode GaAs transistor to define an inverter output terminal;
   GaAs diode means having cathode terminal means electrically coupled to the first node and further having anode terminal means; and
   a third enhancement-mode GaAs transistor having gate terminal means coupled to the second node, and a pair of main terminal means respectively electrically coupled to the anode terminal means and the second power bus means.

2. The inverter of claim 1 wherein the diode means is a Schottky diode inherent in the structure of a GaAs transistor.

* * * * *